United States Patent [19]

Bradley et al.

[11] Patent Number: 4,519,016

[45] Date of Patent: May 21, 1985

[54] PRINTED CIRCUIT BOARD CARD CAGE

[75] Inventors: James D. Bradley, Mound; Gregg B. Amundson, Bloomington, both of Minn.

[73] Assignee: Magnetic Controls Company, Minneapolis, Minn.

[21] Appl. No.: 537,336

[22] Filed: Sep. 29, 1983

[51] Int. Cl.³ .............................................. H05K 7/18
[52] U.S. Cl. ...................................... 361/415; 211/41
[58] Field of Search .......................... 361/415; 211/41

[56] References Cited

U.S. PATENT DOCUMENTS

| 3,377,515 | 4/1968 | Erb | 361/415 |
| 3,878,438 | 4/1975 | Weisman | 361/415 |
| 4,327,835 | 5/1982 | Leger | 361/415 X |
| 4,353,469 | 10/1982 | Etchison et al. | 361/415 X |
| 4,355,819 | 6/1982 | Weisman et al. | 361/415 X |

Primary Examiner—R. R. Kucia
Attorney, Agent, or Firm—Dorsey & Whitney

[57] ABSTRACT

A dual density printed circuit board card cage for housing a plurality of printed circuit board cards in a parallel, stacked relationship. The card cage embodies a unique, intermediate frame member comprising a single piece of sheet metal having a plurality of openings and guide means on opposite sides of the intermediate frame member for mating with corresponding guide means on the upper and lower frame members. The guide means are comprised of a plurality of web portions each including a pair of guide edges extending upwardly and downwardly and in an alternating pattern.

10 Claims, 8 Drawing Figures

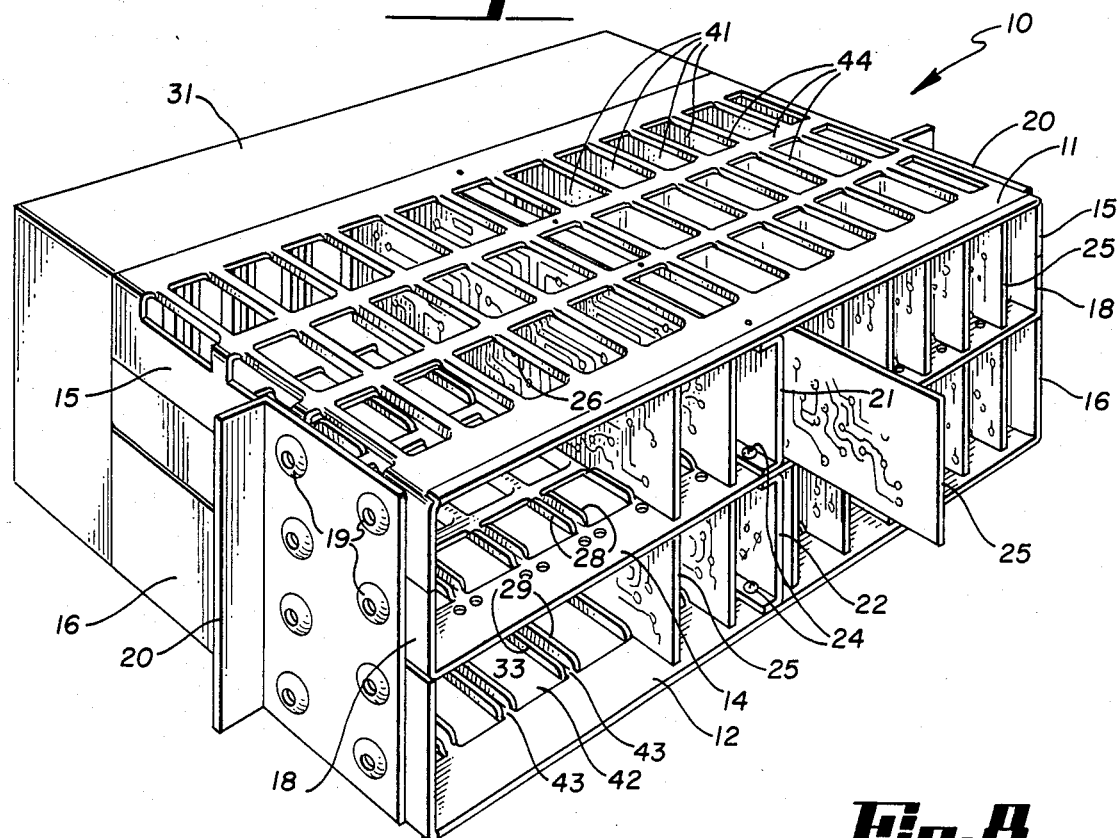
Fig.1
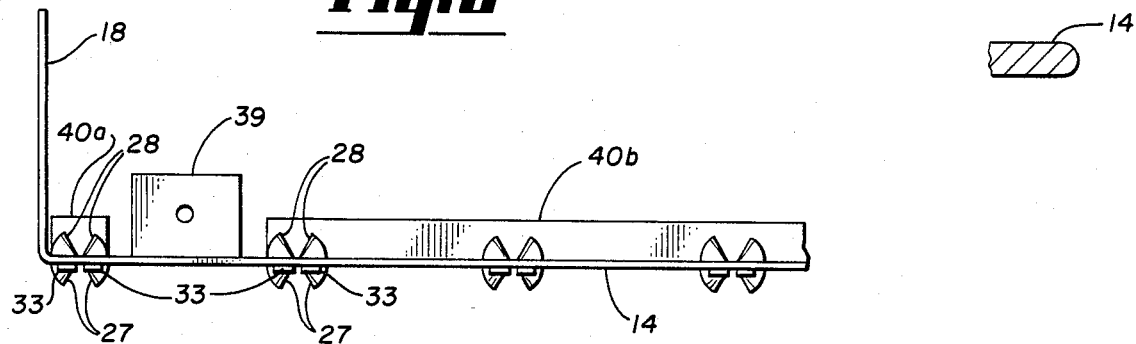
Fig.5
Fig.8
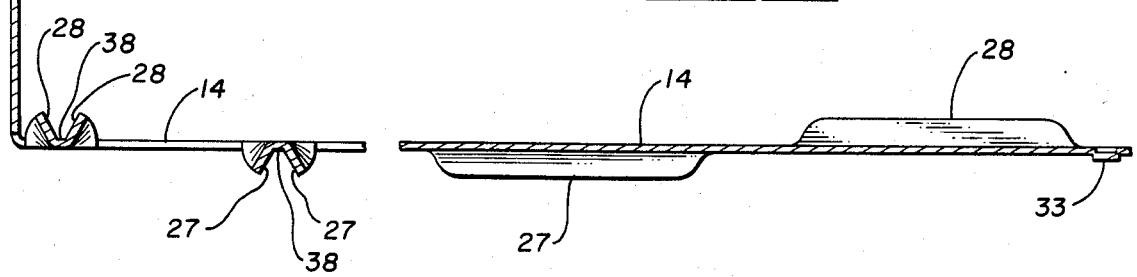
Fig.6
Fig.7

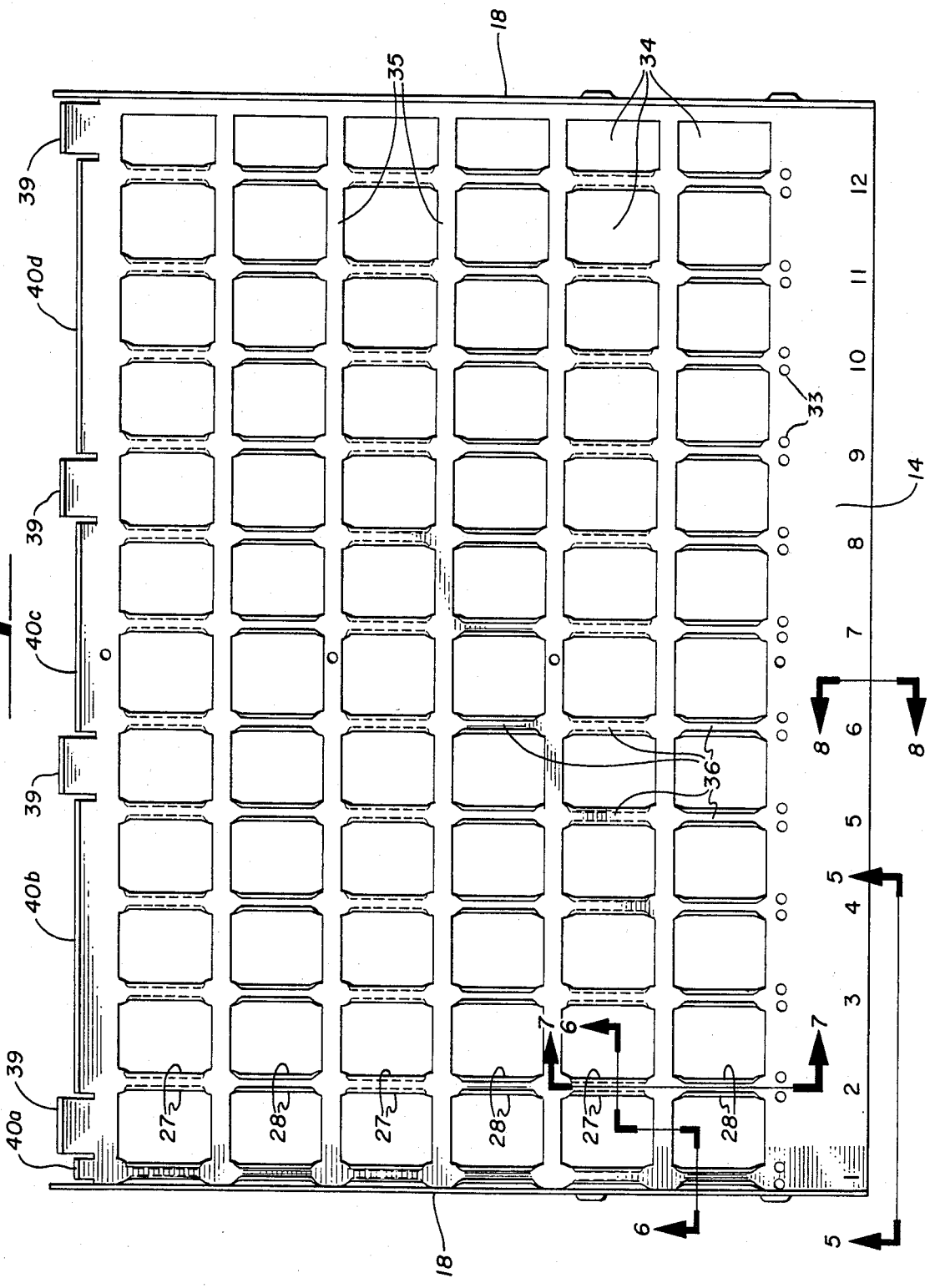

PRINTED CIRCUIT BOARD CARD CAGE

BACKGROUND OF THE INVENTION

The present invention relates to a card cage for printed circuit boards and more particularly to an improvement in a dual density printed circuit board (PCB) card cage.

Printed circuit board card cages conventionally include a pair of spaced apart frame members having a plurality of parallel grooves or channels on their inner surfaces to define guide and support slots for printed circuit board cards. Printed circuit board cards are then retained by these guide slots in parallel spaced relationship between the frame members. A dual density PCB card cage comprises a pair of back-to-back card cages for supporting two sets of printed circuit board cards in a stacked relationship. Conventionally, dual PCB card cages include top and bottom frame members and a pair of back-to-back intermediate frame members for cooperation, respectively, with the top and bottom frame members. Each of the frame members is provided with a plurality of guide and support grooves for supporting and guiding PCB cards into a functioning position.

The prior art shows several efforts relating to the construction of dual PCB card cages. The Etchison, Jr., et al. U.S. Pat. No. 4,353,469 relates to a support shalf for PCB cards and discloses a dual density structure. Although this patent discloses an intermediate support frame which includes means on both its upper and lower surfaces for supporting and guiding the edges of PCB cards, the upper and lower surfaces of this intermediate frame member are vertically spaced from each other and include their own set of guide members. The Leger U.S. Pat. No. 4,327,835 and the Erb U.S. Pat. No. 3,377,515 also relate to dual density PCB card cage constructions. Both of these also comprise a single intermediate frame member; however, they both have individual and separate guide and support inserts which are adapted to be snapped into the intermediate frame member. The Reynolds et al. U.S. Pat. No. 3,733,523 relates to a dual density PCB card cage and includes a single intermediate frame member having a plurality of grooves or channels on opposite sides for purposes of supporting and guiding PCB cards. This intermediate frame member, however, is comprised of a thick-walled panel which appears to be constructed of molded plastic or some other similar material.

Although several attempts have been made in the prior art to provide a dual density PCB card cage which is of relatively inexpensive, simple in construction, yet strong and rigid enough to provide the close tolerances required in a device of this sort, none has been completely successful. Accordingly, there is a need in the art for a dual density PCB card cage having a construction which is relatively simple and inexpensive and which is also strong enough to maintain the structural rigidity needed.

SUMMARY OF THE INVENTION

The present invention relates to a dual density PCB card cage which includes upper and lower or top and bottom frame members and a single intermediate frame member which cooperates with both the upper and lower frame members to support and guide PCB cards into operational alignment. More specifically, the present invention includes a single piece of generally flat metal having a plurality of openings to facilitate air circulation for cooling, etc. and a plurality of guide means disposed in parallel relationship and on opposite sides of the metal frame member for guiding PCB cards into an operable position. Specifically, each of these guide means is defined by a plurality of spaced, colinear guide portions. Preferably, these colinear guide portions are arranged in alternating relationship with guide portions extending in the opposite direction.

In the preferred embodiment of the present invention, the intermediate frame member is constructed of a metal such as steel or aluminum having a thickness between 0.050 and 0.110 inches. The openings in this frame member are separated and defined by a plurality of web portions whose edges are bent to form the generally v-shaped channels or grooves defining the guide means. Despite the alternating pattern of the colinear guide portions, each of the guide means on the upper and lower surfaces of the intermediate frame member includes a continuous support surface throughout its entire length to support the PCB card within the cage.

Construction of a dual density PCB card cage in accordance with the present invention permits the expense to be dramatically reduced. Further, the utilization of a single intermediate frame member facilitates the reduction of the tolerance levels, reduction of overall card cage weight and reduction of assembly time.

Accordingly, it is an object of the present invention to provide a dual density PCB card cage which is simple in construction, inexpensive and which also embodies the necessary strength and rigidity.

Another object of the present invention is to provide a dual density PCB card cage comprising upper and lower frame members and a single intermediate frame member cooperating with the upper and lower frame members, respectively.

A further object of the present invention is to provide a dual density PCB card cage in which the single intermediate frame member includes a plurality of support and guide means on opposite sides for cooperation with the upper and lower frame members, respectively.

Another object of the present invention is to provide a dual density PCB card cage having a single intermediate frame member which is stamped from a flat piece of metal such as steel or aluminum approximately 0.050 to 0.110 inches thick.

These and other objects of the present invention will become apparent with reference to the drawings, the description of the preferred embodiment and the appended claims.

DESCRIPTION OF THE DRAWINGS

FIG. 1 is a pictorial view showing a dual density PCB card cage of the present invention.

FIG. 2 is a top elevational view of the intermediate frame member showing the upper surface of such member.

FIG. 5 is a view, partially in section, of a portion of the intermediate frame member as viewed along the section line 5—5 of FIG. 2.

FIG. 6 is a view, partially in section, of a portion of the intermediate frame member as viewed along the section line 6—6 of FIG. 2.

FIG. 7 is a view, partially in section, of a portion of the intermediate frame member as viewed along the section line 7—7 of FIG. 2.

FIG. 8 is a view, partially in section, of a portion of the intermediate frame member as viewed along the section line 8—8 of FIG. 2.

DESCRIPTION OF THE PREFERRED EMBODIMENT

Figure 3:
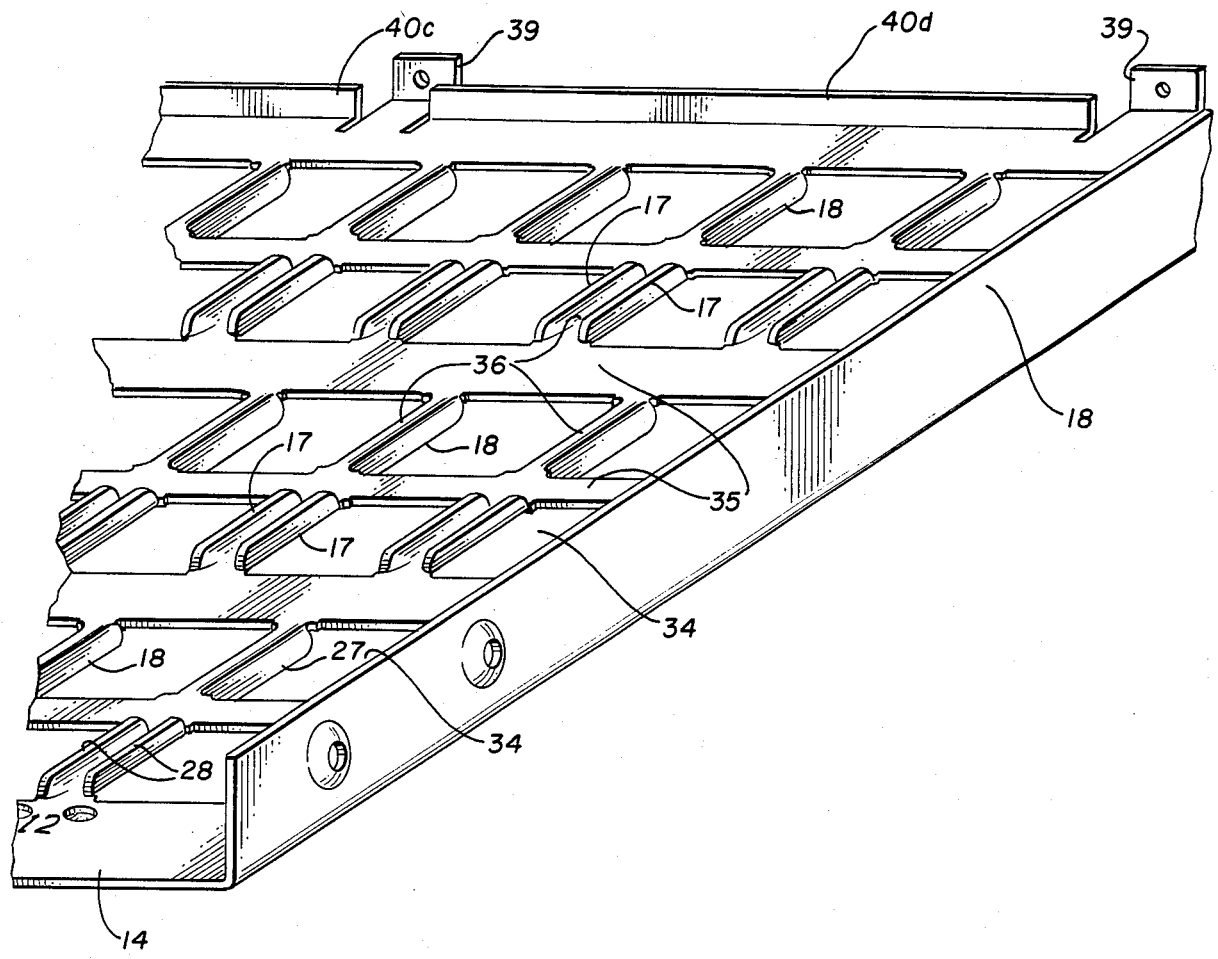
FIG. 3 is a pictorial view of a portion of the intermediate frame member.

The dual density printed circuit board card cage of the present invention is illustrated generally in FIG. 1 by the reference numeral 10. This card cage 10 includes an upper frame menber 11, a lower frame member 12 and an intermediate frame member 14. The frame members 11, 12 and 14 are disposed in parallel relationship with respect to one another and the intermediate frame member 14 is usually equally spaced between the upper and lower frame members 11 and 12 to accommodate similarly sized PCB cards. The frame 14 can, however, be closer to the top or the bottom frame members 11 or 12 to accommodate PCB cards of different sizes. Each side edge of the upper frame member 11 includes a downwardly extending mounting tab or bracket 15, each side edge of the lower frame member 12 includes an upwardly extending mounting tab or bracket 16 and each side edge of the intermediate frame member 14 includes an upwardly extending mounting tab or bracket 18. In the preferred embodiment, each of the mounting tabs 15, 16 and 18 is connected by a plurality of rivets 19 or other appropriate connection means to a side mounting plate 20 which, together with the back plate or connector rear panel 37 (FIG. 4), functions to support the frame member 11, 12 and 14, and maintain the same in properly spaced and aligned relationship. A side mounting plate 20 is provided on each side of the card cage 10.

A pair of elongated, generally U-shaped frame support members 21 and 22 are disposed between the frame members 11 and 14 and the frame members 14 and 12, respectively, to provide structural rigidity and strength to the card cage construction and to maintain proper spaced relationship between the various frame members 11, 12 and 14. The support members 21 and 22 are secured with respect to the frame members 11, 12 and 14 by a plurality of rivets 24 or other connecting members as illustrated.

Figure 4:
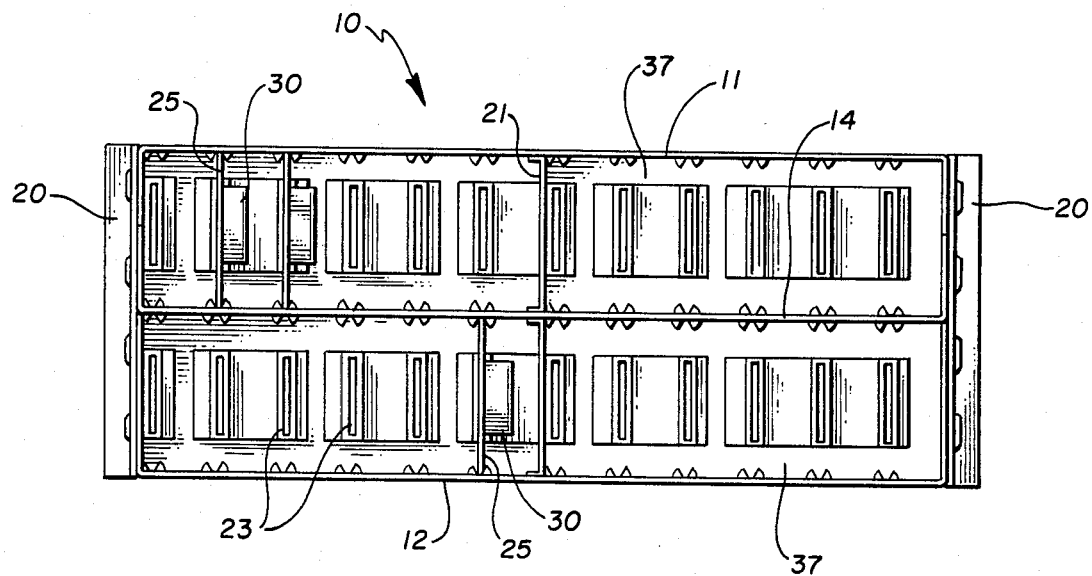
FIG. 4 is front elevational view of the assembled dual density PCB card cage of the present invention.

As shown in FIG. 1 and also in FIG. 4, a plurality of vertically disposed printed circuit board cards 25 are disposed in parallel, spaced relationship between the frame members 11 and 14 and the frame members 14 and 12. As will be described in greater detail below, each of these PCB cards 25 is guided and retained in proper spaced relationship by appropriate opposing guide means embodied in the upper, lower and intermediate frame members 11, 12 and 14. Specifically, the upper frame member 11 is provided with guide means 26, the lower frame member 12 is provided with guide means 29 and intermediate frame member 14 is provided with guide means 27 and 28 on opposite sides thereof. It should be noted that the PCB cards 25 are of standard, conventional construction of the type having one side surface which is relatively free of electrical components and the other side which contains the various electrical components and conductors 30 (FIG. 4) normally found on printed circuit boards. Although the preferred embodiment contemplates printed circuit board cards, the card cage of the present invention is equally applicable to other possible types of electrical cards or cards or boards containing electrical components.

Disposed to the rear of the frame members 11, 12 and 14 is a shroud or housing 31 for a wired subassembly. The wired subassembly consists of various connectors and electrical components which are conventional and within the knowledge of those skilled in the art. Accordingly, the details of the wired subassembly are not specifically illustrated. It is contemplated, however, that this wired subassembly would include a plurality of edge connectors 23 (FIG. 4) for mating with a plurality of edge connector tabs on the printed circuit board cards 25 and appropriate connection means for electrically connecting these edge connectors to conventional connector components for the purpose of providing convenient access to the various circuits in the PCB cards 25. In the preferred embodiment, it is contemplated that conventional edge connectors containing either twenty, fifty-six, or some other number of contacts would be provided for connection with each of the edge connector tabs on the PCB cards 25. The housing 31 is connected via the connector rear panel member 37 to the frame members 11, 12 and 14 by mating mounting tab portions. The mounting tab portions for the intermediae frame member 14 are illustrated best in FIGS. 2 and 3 by the reference numeral 39. When fully connected, the connector rear panel member 37 provides rear support for the frame members 11, 12 and 14 and maintains proper spaced relationship between them.

Reference is next made to FIGS. 2, 3, 5, 6 and 7 showing various structural details of the intermediate frame member 14. FIG. 2 is a top elevational view of the intermediate frame member 14. The frame member 14 is generally rectangularly shaped with front, rear and a pair of side edges and includes a plurality of generally rectangularly shaped openings 34 extending throughout its entirety. Disposed between and defining the openings 34 are a plurality of web portions 36 extending generally parallel to the side edges of the frame member 14 and a plurality of web portions 35 extending generally parallel to the front and rear edges of the frame member 14 and at right angles with respect to the web portions 36. As illustrated, the edges of each of the web portions 36 are bent or formed into a generally V-shaped, configuration to form the guide means for guiding the PCB cards 25 (FIGS. 1 and 4) into the card cage 10 and to maintain the cards in proper spaced relationship when fully inserted. It should be noted that the guide paths, and therefore the respective positions, for the PCB cards 25 in both the upper and lower portions of the dual density card cage 10 are identified by the numbers 1 through 12 disposed along the forward edge of the frame member 14. Each of these guide paths is linear and each is defined by a set of colinear web portions.

The bent edges of the web portions 36 form several pairs of guide edges 28 extending generally upwardly toward the upper frame member 11 and an equal number of pairs of guide edges 27 extending generally downwardly toward the lower frame member 12. As illustrated best in FIGS. 2 and 3, the upwardly extending guide edges 28 and the downwardly extending guide edges 27 are arranged in an alternating pattern along each guide path. Although it is contemplated that any number of upwardly extending or downwardly extending guide edges may be utilized for any particular guide path, the preferred embodiment illustrates a set of three web sections having downwardly extending guide edges 27 and a set of three web sections having upwardly extending guide edges 28. It should be noted that in the preferred embodiment, the guide paths on the upper surface of the member 14 defined by the guide edges 28 are aligned with the guide paths on the lower surface of the member 14 defined by the guide edges 28, but extend in opposite directions. The specific structure of the guide edges 27 and 28 are illustrated best in FIGS. 2, 3, 5, 6 and 7. The guide edges 27 and 28 must be relatively short so as to avoid interference with the structural components 30 (FIG. 4) on the PCB cards 25. In the preferred embodiment, the guide edges 27 and 28 extend outwardly from the web sections 36 for a distance of approximately 0.125 inches. This provides a safety zone and precludes interference with the components 30. The guide edges 27 and 28 are formed by bending the edges of the web portions 36 in the desired direction. As illustrated best in FIG. 6, the cross-sectional configuration of each pair of guide edges 27 and 28 is generally V-shaped in which the guide edges 27 and 28 diverge from a planer surface portion 38 which is defined by a portion of the web sections 36 (FIG. 2).

Despite the existence of the several pairs of guide edges 27 and 28 extending in opposite directions from the frame 14 along each guide path, a common plane is maintained along each guide path throughout the entire length thereof. This facilitates the support of the PCB cards 25 in proper position for engagement with the connection means contained within the housing 31 (FIG. 1). Although it is contemplated that the intermediate frame section 14 can be constructed of a variety of materials with a variety of different thicknesses, the material must have sufficient structural rigidity to support the PCB cards 25 in their desired position and to prevent sagging or other unwanted movement which can lead to malfunction of the system and/or misconnection or non-connection between the edge connectors and the corresponding contacts on the PCB cards 25. It has been found that it is preferable if the material for the intermediate frame member 14 is steel or aluminum. It is also preferable for the thickness of the material to be no less than 0.050 inches and no greater than 0.110 inches. The preferred thickness is approximately 0.075 inches.

As illustrated in FIGS. 2, 3, 5 and 7, the intermediate frame member 14 is provided with a pair of guide portions 33 disposed on the lower surface of the member 14 associated with each of the card locations. The function of these guide portions 33 is to assist in guiding the cards 25 into the guide path defined by the guide edges 27 on the lower surface of the member 14. In the preferred embodiment, the guide portions 33 are formed by half or partially punching the portions 33 from the frame member 14 and are positioned in front of the forwardmost pair of guide edges 27.

It is contemplated that several different methods can be utilized to manufacture the intermediate frame member of the present invention. Preferably, however, it is comprised of a single piece of sheet metal from which the openings 34 are punched or stamped via a punch press or turret press. Thereafter, the guide edges 27 and 28 on both the upper surface and lower surface are bent in accordance with the structure illustrated.

With reference to FIG. 2, it should be noted that the guide means for the card to be positioned to the far left-hand end of the intermediate frame member 14 as shown in FIG. 2 (guide path or card location No. 1) is disposed closely adjacent to the upwardly extending mounting bracket 20; whereas the guide means for the PCB card disposed furthest to the right of the intermediate frame 14 as viewed in FIG. 2 (guide path or card location No. 12) is provided with additional space. The reason for this is to facilitate the use of PCB cards conventional in the art which include electrical components, etc. on only one surface of the card. Thus, the structure of the intermediate frame member 14 as illustrated in FIG. 2 is adapted for use with PCB cards 25 in which the electrical components 30 (FIG. 4) are disposed on the right hand side of the card when the card is inserted into the card cage 10. It should also be noted, as illustrated in FIG. 8, that the front edge of the frame 14 is provided with a radius to prevent damage to the cards 25 as they are inserted and removed.

The back edge of the intermediate frame 14 includes a plurality of mounting tabs 39 extending at right angles with respect to the main plane of the frame member 14. These tab members 39 are provided with openings for appropriate connection to mating tabs and portions of the subassembly housing 31. The preferred embodiment shows these tabs extending upwardly although they can also extend downwardly if desired. The rearward end of the intermediate frame member 14 is also provided with a plurality of card stop tabs or members 40 (a–d) which are also disposed at generally right angles with respect to the planer surface of the frame member 14. These card stop members 40 function to limit the movement of the PCB cards 25 (FIGS. 1 and 4) into the card cage 10. In the preferred embodiment, the frame member 14 is provided with four card stop sections 40a, 40b, 40c and 40d. These card stops serve to limit the inward movement of cards at various card receiving locations. Specifically, the stop member 40a limits the movement of PCB cards at card location No. 1, the stop member 40b limits the movement of PCB cards at card locations Nos. 2-5, the stop member 40c limits movement of the cards at card locations 6 to 8, and the stop member 40d limits movement of the cards at card locations 9 to 12.

As illustrated best in FIGS. 1 and 4, the upper frame member 11 and the lower frame member 12 are also provided with a plurality of openings 41 and 42, respectively. Similar to the intermediate frame member 14, the openings 41 and 42 are separated and defined by various web portions 44 and 43, respectively. The web portions 44 in the upper frame member 11 which extend in a direction parallel to the side edges of the frame member 11 are bent or formed downwardly to form the generally V-shaped guide means for guiding the PCB cards 25 into an operable position within the card cage 10. These guide means can be of any particular type, however, preferably they are similar to the guide means of the intermediate frame member 14 in that they comprise a plurality of pairs of guide edges having a generally V-shaped cross-sectional configuration. However, unlike the intermediate section 14, the guide edges 26 in the upper frame member 11 extend only in one direction, namely, in a direction which faces the intermediate frame member 14.

Simlarly, the lower frame member 12 is provided with a plurality of spaced guide means for guiding a plurality of PCB cards 25 between the lower frame member 12 and intermediate frame member 14 and into an operable position within the card cage 10. Specifically, these guide means each comprise a plurality of pairs of guide edges 29 bent into a generally V-shaped cross-sectional configuration in a manner similar to that of the upper frame member 11. The guide means of the frame member 11 can have a variety of configurations, however, they preferably are similar to those of the frame member 14. As illustrated, the guide edges 29 are bent in a direction toward the intermediate frame member 14 so that they provide corresponding guide paths with respect to the guide edges 27.

The front edges of both the upper and lower frame members 11 and 12 are provided with a French Roll comprising a porton of the edge being folded back against itself. This forms a rounded front edge and prevents damage to the cards when they are inserted or removed from the cage.

During operation, printed circuit board cards 25 (FIG. 1) may be inserted into the cage 10 by sliding the same into mating guide paths defined by the opposing guide edges between frame members 11 and 14 and between frame members 14 and 12. For example, the downwardly extending guide edges 26 of the upper frame member 11 mate with corresponding upwardly extending guide edges 28 on the upper surface of the intermediate frame member 14. Similarly, the upwardly extending guide edges 29 on the lower frame member 12 mate with the correspondingly positioned downwardly extending guide edges 27 and the guide portions 33 on the bottom surface of the intermediate frame member 14. This provision of an intermediate frame section formed of the single piece of sheet metal with a plurality of guide sections each comprising a pair of guide edges which are arranged in an alternating pattern has proven to be a significant improvement in dual density PCB card cage construction and has led to dramatic reduction of costs and assembly time while maintaining the needed structural rigidity, cooling and weight requirements.

Although the description of the preferred embodiment has been quite specific, it is contemplated that various changes could be made without deviating from the spirit of the present invention.

Accordingly, it is intended that the scope of the present invention be dictated by the appended claims rather than by the description of the preferred embodiment.

We claim:

1. A dual density printed circuit board card cage comprising:
    an upper frame member having a plurality of spaced guide means for engaging an edge of a printed circuit board card and guiding the same into an operable position within said card cage;
    a lower frame member having a plurality of spaced guide means for engaging an edge of a printed circuit board card and guiding the same into an operable position within said card cage; and
    an intermediate frame member having front, back and a pair of side edges, an upper and a lower surface and being spaced in parallel relationship between said upper and lower frame members, said intermediate frame member comprising a generally flat sheet of metal having a plurality of openings separated from each other by a plurality of web portions and a plurality of spaced, guide means on both its upper and lower surfaces for engaging an edge of a printed circuit board card and guiding the same into an operable position with said card cage, each of said guide means on the upper surface of said intermediate frame member being aligned and adapted for cooperation with a corresponding guide means of said upper frame member and each of said guide means on the lower surface of said intermediate frame member being aligned and adapted for cooperation with a corresponding guide means of said lower frame member, the plurality of guide means on the upper and lower surfaces of said intermediate frame member further being arranged in opposing pairs of guide means which are aligned with one another but which face in opposite directions, each of said opposing pairs of guide means being formed by a plurality of guide sections comprised of at least one pair of guide edges extending generally toward said upper frame member and at least one pair of guide edges extending generally toward said lower frame member.

2. The card cage of claim 1 wherein said plurality of web portions include a plurality of first web portions extending in a direction generally parallel to said front and back edges and a plurality of second web portions extending in a direction generally parallel to said front and back edges.

3. The card cage of claim 2 wherein each of said guide means on said upper and lower surfaces of said intermediate frame member is defined by a set of colinear first web portions.

4. The card cage of claim 3 wherein the edges of the web portions of said set of colinear first web portions are bent either generally toward said upper frame member or generally toward said lower frame member to form said pairs of guide edges.

5. The card cage of claim 4 wherein said pairs of guide edges extend generally toward said upper frame member and generally toward said lower frame member in an alternating pattern.

6. The card cage of claim 5 wherein each guide means of said intermediate frame member includes at least two pairs of guide edges separated by a pair of guide edges extending in generally the opposite direction.

7. The card cage of claim 1 wherein the front edge of said intermediate frame member is provided with a radius.

8. The card cage of claim 1 including a plurality of guide portions disposed on the lower surface of said intermediate frame member.

9. The card cage of claim 8 wherein each of said plurality of guide portions includes a pair of guide elements positioned forward of and aligned with a corresponding pair of guide edges extending toward said lower frame member.

10. An intermediate frame member for use in a dual density electrical card cage having an upper frame member having a plurality of spaced guide means for engaging an edge of an electrical card and guiding the same into an operable position within said card cage and a lower frame member having a plurality of spaced guide means for engaging an edge of an electrical card and guiding the same into an operable position within said card cage, said intermediate frame having front, back and a pair of side edges, an upper and a lower surface and being spaced in parallel relationship between said upper and lower frame members, said intermediate frame member comprising a generally flat sheet of metal having a plurality of openings separated from each other by a plurality of web portions and a plurality of spaced, guide means on both its upper and lower surfaces for engaging an edge of an electrical card and guiding the same into an operable position with said card cage, each of said guide means on the upper surface of said intermediate frame member being aligned and adapted for cooperation with a corresponding guide means of said upper frame member and each of said guide means on the lower surface of said intermediate frame member being aligned and adapted for cooperation with a corresponding guide means of said lower frame member, the plurality of guide means on the upper and lower surfaces of said intermediate frame member further being arranged in opposing pairs of guide means which are aligned with one another but which face in opposite directions, each of said opposing pairs of guide means being formed by a plurality of guide sections comprised of at least one pair of guide edges extending generally toward said upper frame member and at least one pair of guide edges extending generally toward said lower frame member.

* * * * *